(12) United States Patent
Spaanderdam et al.

(10) Patent No.: US 10,056,239 B2
(45) Date of Patent: Aug. 21, 2018

(54) ELECTRICAL VACUUM-COMPATIBLE FEEDTHROUGH STRUCTURE AND DETECTOR ASSEMBLY USING SUCH FEEDTHROUGH STRUCTURE

(71) Applicant: Particle Physics Inside Products B.V., Amsterdam (NL)

(72) Inventors: Dirk-Jan Spaanderdam, Utrecht (NL); Julia Helga Jungmann, Sappemeer (NL); Ronald Martinus Alexander Heeren, Weesp (NL)

(73) Assignee: PARTICLE PHYSICS INSIDE PRODUCTS B.V., Amsterdam (NL)

( * ) Notice: Subject to any disclaimer, the term of this patent is extended or adjusted under 35 U.S.C. 154(b) by 0 days.

(21) Appl. No.: 14/443,913

(22) PCT Filed: Nov. 19, 2013

(86) PCT No.: PCT/EP2013/074172
§ 371 (c)(1),
(2) Date: May 19, 2015

(87) PCT Pub. No.: WO2014/076303
PCT Pub. Date: May 22, 2014

(65) Prior Publication Data
US 2015/0348766 A1 Dec. 3, 2015

(30) Foreign Application Priority Data
Nov. 19, 2012 (EP) ..................................... 12007812

(51) Int. Cl.
*H05K 1/11* (2006.01)
*H01J 49/00* (2006.01)
(Continued)

(52) U.S. Cl.
CPC ........ *H01J 49/0004* (2013.01); *H01J 49/022* (2013.01); *H01J 49/025* (2013.01);
(Continued)

(58) Field of Classification Search
CPC ...... H01J 49/0004; H01J 49/022; H01J 49/24; H01J 49/025; H05K 1/11; H05K 1/0298;
(Continued)

(56) References Cited

U.S. PATENT DOCUMENTS 4,322,682 A * 3/1982 Schadwill .......... G01R 1/07328
324/750.25
6,316,768 B1 11/2001 Rockwood
(Continued)

FOREIGN PATENT DOCUMENTS

JP 2000138429 5/2000
WO 9219007 10/1992

OTHER PUBLICATIONS

International Search Report and Written Opinion for corresponding foreign application PCT/EP2013/074172, filed Nov. 19, 2013.
(Continued)

*Primary Examiner* — Brooke Purinton
(74) *Attorney, Agent, or Firm* — Steven M. Koehler; Westman, Champlin & Koehler, P.A.

(57) ABSTRACT

An ultra-high vacuum (UHV) compatible feedthrough structure and a detector assembly using such feedthrough structure, the feedthrough structure comprising a printed circuit board (PCB) for carrying one or more detectors, wherein said PCB comprises a top surface covered with a first UHV sealing layer and one or more first electrical electrodes and at least a first thermally conductive layer extending at least partly over said top surface; and, a back surface comprising one or more second electrodes and at least a second thermally conductive layer extending at least partly over said
(Continued)

back surface, wherein one or more conductive wires are embedded in said PCB for electrically connecting said one or more first electrodes with said one or more second electrodes respectively; and, wherein one or more thermally conductive vias are embedded in said PCB for thermally connecting said at least first thermally conductive layer with said second thermally conductive layer.

19 Claims, 8 Drawing Sheets

(51) Int. Cl.
  *H05K 1/02* (2006.01)
  *H01J 49/02* (2006.01)
  *H01J 49/24* (2006.01)
  *H05K 3/46* (2006.01)
(52) U.S. Cl.
  CPC ............... *H01J 49/24* (2013.01); *H05K 1/02* (2013.01); *H05K 1/0206* (2013.01); *H05K 1/0298* (2013.01); *H05K 1/11* (2013.01); *H05K 3/4688* (2013.01); *H05K 2201/0141* (2013.01); *H05K 2201/09154* (2013.01); *H05K 2201/09781* (2013.01); *H05K 2203/1147* (2013.01)
(58) Field of Classification Search
  CPC .................. H05K 1/0206; H05K 1/02; H05K 2203/1147; H05K 2201/0141; H05K 3/4688; H05K 2201/09154; H05K 2201/09781
  See application file for complete search history.

(56) References Cited

U.S. PATENT DOCUMENTS

| 6,350,964 | B1* | 2/2002 | Boas | H01L 21/67115 |
| --- | --- | --- | --- | --- |
| | | | | 118/724 |
| 2007/0018092 | A1* | 1/2007 | King | H01J 49/40 |
| | | | | 250/287 |
| 2007/0221843 | A1* | 9/2007 | Ward | B82Y 10/00 |
| | | | | 250/309 |
| 2008/0219567 | A1* | 9/2008 | Claus | H04N 19/593 |
| | | | | 382/232 |
| 2009/0183829 | A1* | 7/2009 | Rendek, Jr. | H05K 3/0014 |
| | | | | 156/285 |
| 2010/0233910 | A1* | 9/2010 | Zhang | H01R 12/712 |
| | | | | 439/626 |

OTHER PUBLICATIONS

Sabine Sengelmann: "Large-area Medipix3 project", Sep. 23, 2010.
Jungmann et al., "Fast, High Resolution Mass Spectrometry Imaging Using a Medipix Pixelated Detector", Journal of the American Society of Mass Spectrometry 21, 2023-2030 (2010).

* cited by examiner

ELECTRICAL VACUUM-COMPATIBLE FEEDTHROUGH STRUCTURE AND DETECTOR ASSEMBLY USING SUCH FEEDTHROUGH STRUCTURE

CROSS-REFERENCE TO RELATED APPLICATION

The present application is a national stage filing of International patent application Serial No. PCT/EP2013/074172, filed Nov. 19, 2013, and published as WO 2014/076303 A1 in English.

FIELD OF THE INVENTION

The invention generally relates to an electrical vacuum-compatible feedthrough structure and detector assembly using such electrical feedthrough structure, and, in particular, though not exclusively, to at least a high-voltage electrical vacuum-compatible feedthrough structure, a high-voltage detector assembly using such vacuum feedthrough structure and an ion microscope having a positive and negative ion mode using such vacuum feedthrough structure.

BACKGROUND OF THE INVENTION

The discussion below is merely provided for general background information and is not intended to be used as an aid in determining the scope of the claimed subject matter.

Mass spectrometry imaging (MSI) is a technique that allows simultaneous chemical and/or molecular analysis of a sample and to visualize the spatial distribution of the sample by their molecular masses.

In an ion microscope mode MSI system, a laser-ionization technique such as matrix-assisted laser desorption ionization (MALDI) or a primary beam of energetic particles as in secondary ion mass spectrometry (SIMS) may be used to ablate/ionize ions from a sample surface. The ions are electro-statically guided by ion optics to a detector system wherein the spatial information of the sample is preserved and the ion optical image is magnified. The full ion load may be detected by the detector system, comprising a chevron micro-channel plate (MCP) stack and a pixelated position-sensitive and time-sensitive detector. The detected position- and time-information enables molecular imaging and m/z identification and analysis. Such MSI imaging configuration may also be referred to as an ion microscope mass spectrometer or—in short—an ion microscope. The whole MSI process is performed in a vacuum chamber, which is kept at a high vacuum pressure.

An exemplary state-of-the art MSI system is described in the article by Jungmann et al., "Fast, High Resolution Mass Spectrometry Imaging Using a Medipix Pixelated Detector", Journal of the American Society of Mass Spectrometry 21, 2023-2030 (2010). In this system state-of-the-art Medipix detectors are used, which is capable of time-resolved measurements with a time resolution of 10 ns. Four Medipix detectors are arranged in a 2×2 tiled configuration in order to provide an active detection area of around 8 cm². These pixelated detectors produce large amounts of data (in order of 1 Gigabits/second or more), which require fast read-out electronics. Due to these data acquisition requirements, a substantial part of the readout electronics is mounted in the vacuum chamber close to the detector.

It is highly desirable to extend the use of ion microscopes such as the MSI system described by Jungmann et al to the analysis and imaging of large-area high-mass macromolecular complexes of m/z values larger than 100 kDa (e.g. large protein complexes, viruses and bacterial clusters), which are present in bio-molecular, medical and/or pharmaceutical samples. Prior art MSI system however limited capabilities for analysing such high-mass macromolecular complexes due to a number of shortcomings.

One problem is the so-called "high-mass roll-off" of the MCP detector. An MCP depends on the generation of secondary electrons wherein the generation of the secondary electron avalanche is proportional to the velocity of the incoming particle. As all particles are given the same initial kinetic energy, high mass ions will impinge on the detector with a relatively low velocity/momentum. Hence, these high-mass ions will have insufficient energy for the MCP to generate an electron shower and as a result high-mass ions are not detected.

Increasing the acceleration voltage to higher values may solve the high-mass roll-off problem. However, in the known MSI system the detector is held at ground potential so that the detection system is limited to one-polarity acceleration voltages of about 5 kV. Moreover, precise and accurate imaging of high-mass ions by the MCP/detector combination at high voltages requires ultra-high vacuum, i.e. $10^{-9}$ mbar and lower, over the full length of the spectrometer all the way up to the detector side. In the known MSI system however a substantial part of the read-out electronics is mounted in-vacuum in the vacuum chamber close to the detector. For that reason, the pressure at the detector side cannot get lower than about $10^{-7}$ mbar because of outgassing of the vacuum-incompatible readout board.

The fact that the prior art microscope mode MSI systems are only suitable for acceleration voltages of one polarity poses serious limitations to its suitability for high-mass applications as in the analyses of high-mass macromolecular complexes the information associated with positive and information associated with negative ions are complementary and crucial for a full analysis the sample.

Extending the known MSI system to high acceleration voltages of both polarities thus poses some serious technical challenges. Hence, there is a need in the art for a detection system, which allows ion microscopy at high acceleration voltages and ultra-high vacuum conditions. Further, there is a need for a high-voltage detection system, which allows both positive and negative mode ion microscopy.

SUMMARY OF THE INVENTION

This Summary and the Abstract herein are provided to introduce a selection of concepts in a simplified form that are further described below in the Detailed Description. This Summary and the Abstract are not intended to identify key features or essential features of the claimed subject matter, nor are they intended to be used as an aid in determining the scope of the claimed subject matter. The claimed subject matter is not limited to implementations that solve any or all disadvantages noted in the background.

In a first aspect the invention may relate to an electrical ultra-high vacuum (UHV) compatible feedthrough structure wherein said structure may comprise: a printed circuit board (PCB) for carrying one or more detectors, wherein said PCB comprises a top surface and a back surface, wherein said top surface is covered with a first UHV sealing layer, preferably said first sealing layer comprising a liquid crystal polymer material; and, wherein said top surface comprises one or more first electrical electrodes and at least a first thermally conductive layer extending at least partly over said top surface; and, wherein said back surface comprises one or more second electrodes and at least a second thermally conductive layer extending at least partly over said back surface, said PCB further comprising one or more conductive wires embedded in said PCB for electrically connecting said one or more first electrodes with said one or more second electrodes respectively; and, said PCB further comprising one or more thermally conductive vias embedded in said PCB for thermally connecting said at least first thermally conductive layer with said second thermally conductive layer.

In order to enable operation of detector assemblies at high-high voltages, an ultra-high vacuum (UHV) electrical feedthrough structure may act as an ultra-high vacuum seal. One side of the structure may comprise a chip carrier for carrying one or more detectors exposed to charged particles (of both polarities) and for mounting of the detectors inside the UHV vacuum chamber, while the other side of the chip carrier is exposed to ambient pressures and allows multiple, parallel electrical connections of the high-speed read-out electronics and the cooling electronics in close vicinity of the pixelated detectors.

The (ultra)high-vacuum compatible chip carrier acts as a vacuum seal between the detectors and the read-out electronics, thereby eliminating the problem of outgassing of read-out electronics within the vacuum chamber and allowing to bring the read-out electronics outside the vacuum chamber. This way, the high vacuum compatible chip carrier enables the realization of UHV pressures down to $10^{-9}$ mbar in the entire analyzer chamber, including the pressure at the detector side.

In an embodiment said at least one first and second thermally conductive layers may be thermally coupled to each other by a plurality of thermally conductive vias extending through said PCB. In an embodiment said plurality of thermally conductive vias forming an array having an array pitch selected between 2 and 20 mm.

In an embodiment, said back surface may be covered with a second UHV sealing layer, preferably said second sealing layer comprising a liquid crystal polymer material; and/or, wherein the edges of said PCB are sealed with at least one metallic layer, preferably said metallic layer comprising copper and/or indium.

Outgassing of the chip carrier itself is eliminated or at least significantly reduced by sealing the chip carrier, which may be a PCB (printed-circuit board)-type chip carrier, using a liquid crystal polymer (LCP) sealing layer. Ultra-high vacuum sealing may also be achieved using a sealant comprising an ultra-low outgassing material such as Neoflon® PolyChloroTriFluoroEthylene or DuPont Vespel® SP-1 Polyimide. The high vacuum compatible chip carrier comprises integrated metallic vias for providing a high-density and high-speed electrical connection between the detectors and the read-out electronics.

In a further embodiment said feedthrough structure may comprise a support structure, said support structure comprising a (metal, preferably copper) support block fixed to the backside of said PCB, said support block being in thermal contact with said second thermally conductive layer, wherein said support block comprises one or more openings exposing parts of the backside of said PCB, said parts of said backside being parts wherein said one or more second electrodes are located and wherein optionally said one or more electrodes being configured in an electrical connector fixed to the backside of said PCB.

In an embodiment said support structure may further comprise an (ultra-)high vacuum flange structure, wherein said flange structure comprises an opening, wherein said opening has a surface for receiving said PCB and wherein the edge of said PCB are vacuum-tight fixed to the surface of said opening, optionally said support block being configured to press the edges of said PCB to the surface of said opening.

Hence, the chip carrier comprises metallic vias for providing direct thermal contact with a low temperature thermal reservoir close to the pixelated detectors. The thermal reservoir may be a copper block, which is in thermal contact with a substantial part of the back of the chip carrier. The copper block further functions as a mechanical support for pressure differences across the carrier. Cooling of the detectors in a UHV environment is crucial as such detectors typically generate a power within a range between tens μW up to 1 mW per pixel.

In a further aspect, the invention may relate to a vacuum-compatible detector assembly comprising an electrical vacuum-compatible feedthrough structure as described above wherein, said detector assembly may comprise: one or more detectors mounted on the top surface of said PCB, said one or more detectors being in thermal contact with said first thermally conductive surface and wherein said one or more detectors are electrically connected to said first electrical contacts, preferably said one or more detectors being one or more position-sensitive and, optionally, time sensitive (pixelated) detectors, more preferably said one or more detectors being Medipix or Timepix detectors.

In an embodiment said support block may be a thermally conductive metal support block, preferably said metal comprising copper, said detector assembly further comprising cooling means, preferably one or more Peltier elements, thermally connected to said support block for dissipating heat produced by said one or more detectors, which are in thermal contact with said support block.

In an embodiment said detector assembly may further comprise: a read-out board comprising read-out electronics for reading data generated by said one or more detectors, wherein said read-out electronics are electrically connected to said second electrical contacts.

In the further aspect, the invention may relate to the use of a vacuum-compatible detector assembly as described above in time- and/or position-sensitive measurements of particles and/or radiation (such as X-ray radiation).

In yet a further aspect, the invention may relate to a detector system, preferably an ion microscope type mass spectrometry imaging system, wherein said one or more detectors may be mounted in a ultra-high vacuum chamber, preferably said vacuum being $10^{-9}$ mbar or lower, wherein said one or more detectors may be electrically isolated from said vacuum chamber.

In one embodiment, said one or more detectors may be part of an ultra-high vacuum detector assembly as described above, wherein the detector assembly is electrically isolated from said vacuum chamber.

In one embodiment said one or more detectors or said detector assembly may be connected to a high-voltage source which is configured to bias said detector assembly at a floating high-voltage, preferably said high-voltage being selected between +50 kV and −50 kV.

In order to realize a microscope mode MSI system which is capable of handling high acceleration voltages, a detector system is proposed that is configured for operating at a floating high voltage within a range between +50 kV and −50 kV. To that end, the detector assembly is electrically insulated and shielded from the mass spectrometer body (the vacuum chamber). As the detector system is operated at a floating high voltage, the whole detector assembly, i.e. the detectors mounted onto the high vacuum compatible chip carrier, the read-out electronics, power supplies cooling system is floating at the same potential as the detectors.

In an embodiment said high-voltage biased detector assembly may comprise one or more signal converters for converting signals from the read-out electronics into an optical signal. As the (Ethernet) signal originating from the read-out electronics and the signal for triggering the timing measurement is at high voltage, the signals are transmitted via a non-conductive optical fiber to a signal processing station.

In another embodiment said a vacuum chamber comprises a sample holder, a surface probe and an ion microscope and wherein said detector assembly further comprises at least one micro-channel plate.

In a further aspect, the invention may relate to the use of the detector system as described above as a ion microscope MSI system in the positive ion mode, wherein one or more detectors are biased at a voltage value between −5 kV and −50 kV and, optionally, wherein said sample holder may be biased at a voltage value between 1 and 5 kV.

In yet a further aspect, the invention may relate to the use of the detector system as described above as a ion microscope MSI system in the negative ion mode, wherein one or more detectors may be biased at a voltage value between +5 kV and +50 kV, and, optionally, wherein said sample holder may be biased at a voltage value between −1 and −5 kV.

The invention will be further illustrated with reference to the attached drawings, which schematically will show embodiments according to the invention. It will be understood that the invention is not in any way restricted to these specific embodiments.

DETAILED DESCRIPTION

Figures 1A, 1B:
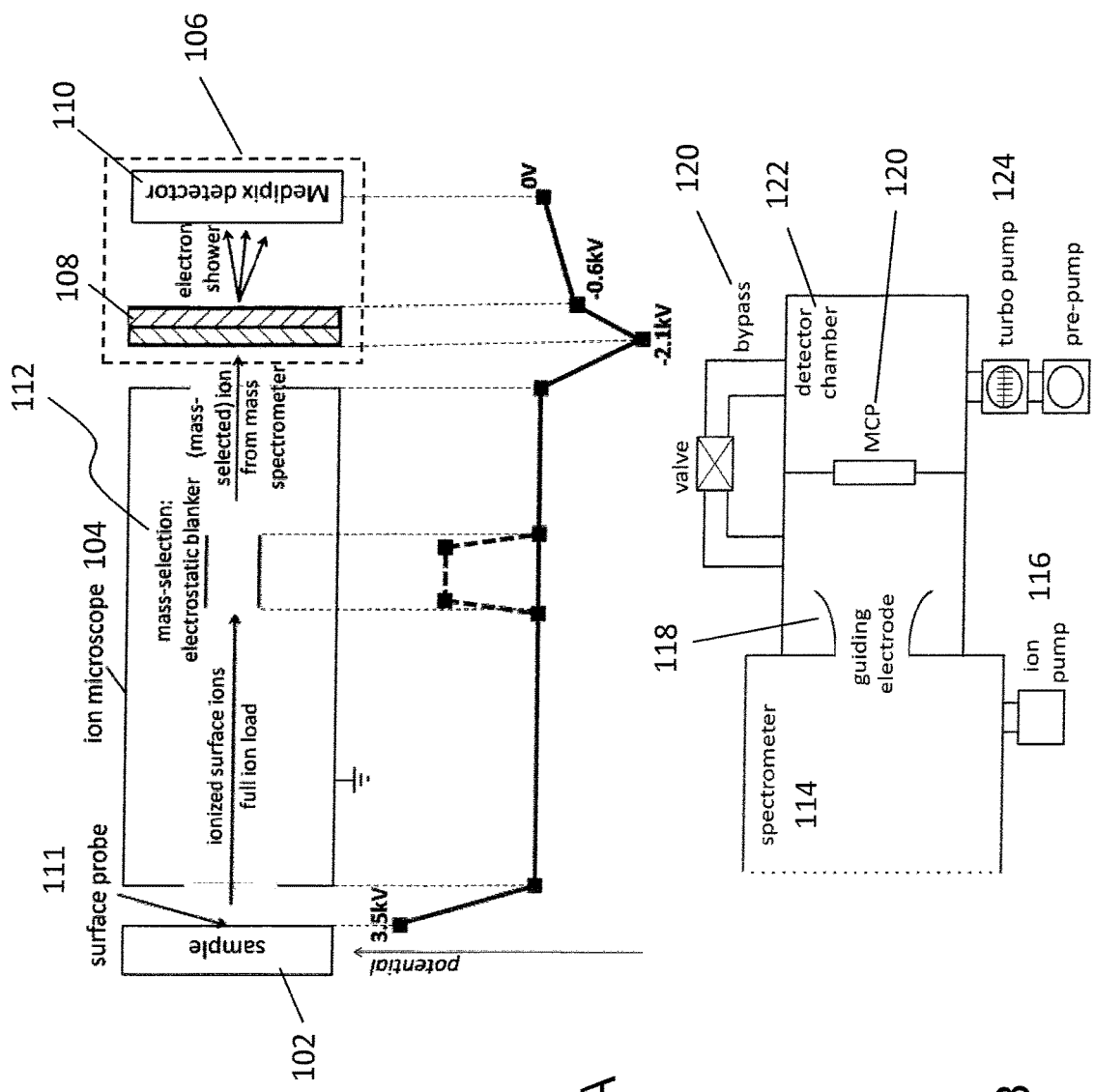
FIGS. 1A and 1B depicts schematics of parts of a conventional MSI system.

FIGS. 1A and 1B depicts schematics of parts of a known MSI system. The sample may comprise a sample holder 102, an ion microscope 104 and a detector system 106 comprising a micro-channel plate (MCP) 108 and an imaging detector 110. A large area surface probe 111 may generate a large area beam of desorbed and ionized particles. For example, a laser system configured to perform matrix-assisted laser desorption ionization (MALDI) may be used to ablate/ionize ions from the sample surface.

As the sample holder and the MCP are biased at a particular voltage with respect to the ion microscope, ionized analytes are subjected to an electrical field, which extracts the analytes from the sample surface and guides the analytes into the ion microscope. The ion microscope comprises ion optics for preserving the spatial information of the sample is preserved. In addition, the ion optics may be configured to magnify the ion optical image. In order to allow preservation and magnification of the ion image, the sample holder, the ion microscope and the detector are located in high vacuum. The vacuum keeps the mean free path of ions as large as possible so that the position and the velocity of an ion moving towards the detector does not change due to collisions with other particles in the system.

An electrostatic blanker 112 may be used to select m/z species of the full ion load. The MCP is exposed to the mass-selected ion load. A MCP is a thinly sliced plate that consists of several millions of parallel, small diameter, conductive glass tubes, which have been fused together. Typical pore diameters are 10 μm to 100 μm and channel length-to-diameter ratios are 40 to 100. The channel axes typically assume a small angle (<10 degrees) with respect to the normal to the MCP surface to enhance primary particle detection. A bias voltage is applied across the plate(s). When a primary particle hits the wall of a MCP channel, it liberates secondary electrons. Similar to the working mechanism of a photomultiplier, these electrons free more electrons in turn. Each channel works as an independent secondary electron multiplier. The MCP is used as a conversion/amplification medium, which translates a single ion event into a measurable signal. MCPs can be sensitive to electrons, ions, photons (in the ultra-violet (UV) and soft X-rays) and neutrons (possibly in combination with an enhancing coating) etc.

When particles (e.g. ions) or radiation impinges on the MCP, one or more micro channels will generate one or more electron showers, which are detected by a position-sensitive (pixelated) and time-sensitive detector such as the Medipix detector.

Initially all ions are accelerated by an electrical potential with the goal to give every ion the same initial kinetic energy. Ions with a high mass will move through the ion microscope with a smaller speed than ions with a smaller mass so that ions with different masses will arrive at different arrival times at the detector. The time-of-arrival (TOF) of an ion, i.e. the time needed for an ion to travel from the sample surface to the detector, is therefore a measure for its mass.

The Medipix detector is a CMOS active pixel sensor that allows measurements of arrival times. Each pixel comprises of an analogue detection part and a digital part that can be configured in the time-of-flight (TOF) mode. In this mode, a pixel measures the occurrence time of an event with respect to an external trigger/shutter signal, e.g. the laser pulse that is used to ablate/ionize ions from the sample surface. The Medipix detector returns the localization of the event via the pixel address (x- and y-coordinate) and the corresponding TOF.

FIG. 1A further depicts a potential diagram of the voltage potential within the system. In this case, the sample holder is biased at a voltage of +3.5 kV, an electrode at the location of the MCP stack is biased at a voltage of −2.1 kV and the detector was held at ground so that the ions are subjected to an acceleration voltage of 5.6 kV. Due to the fact that the detector was fixed to ground, the system can only be operated in the positive ion mode (i.e. it is only capable of detecting and imaging positively charged ions).

The sample holder with sample, the ion microscope and the detector system are operated in high vacuum. FIG. 1B depicts part of the differential pumping scheme of the MSI system. In the set-up the sample and ion microscope are located in the spectrometer vacuum chamber 114, which is pumped by an ion pump 116. The spectrometer vacuum chamber comprises an opening with guiding electrodes 118 for guiding the ions towards the MCP 120. The MCP separates the vacuum of the spectrometer and the vacuum of the detector chamber 122, which comprises the detector and its read-out electronics. A turbo pump 124 pumps the detector chamber and a bypass 126 between the spectrometer and detector chamber protects the MCP from critical pressure gradients during pumping.

The read-out electronics out-gasses and are not designed for high vacuum compatibility. Therefore the detector is operated in a differential pumping geometry, where the vacuum chamber is constructed in such a way that the MCP represents the conduction limit between the mass spectrometer vacuum system ($P=10^{-8}$ mbar) and the vacuum chamber that houses the detector and its associated electronics ($P=10^{-7}$ mbar). A bypass between the mass spectrometer vacuum chamber and the detector vacuum chamber protects the MCP from pressure differences during pumping.

Hence, from the above it follows that although the known MSI system allows capturing of time-resolved images of a wide range m/z species in one measurement, the one-polarity acceleration voltages of maximum 5 kV (i.e. +3 kV sample potential and −2 kV MCP front bias) and the relatively high pressure of the vacuum at the detector side does not render it suitable or at least less suitable for accurately measuring high ion masses, e.g. ion masses above 100 kDa.

Figure 2:
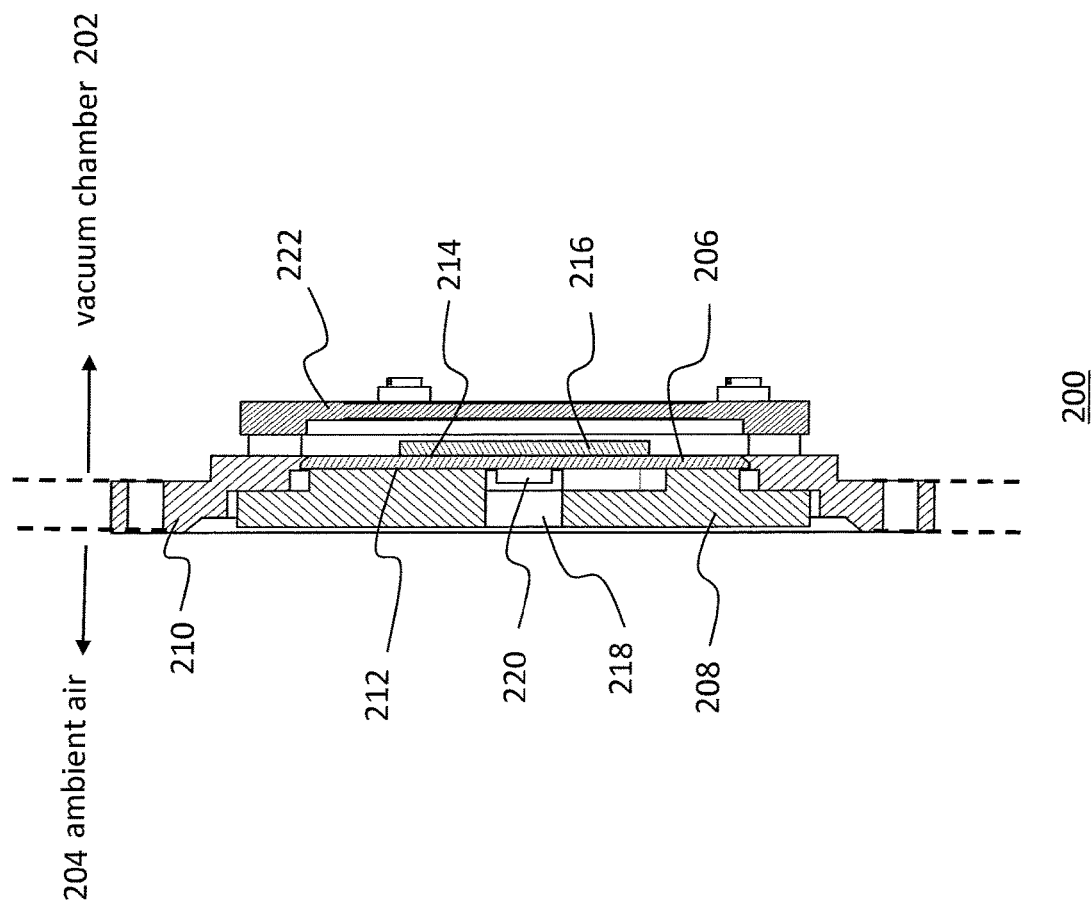
FIG. 2 depicts an ultra-high vacuum compatible detector assembly according to an embodiment of the invention.

FIG. 2 depicts a schematic of an electrical vacuum feedthrough structure according to an embodiment of the invention. In particular, FIG. 2 depicts a multiple highly parallel electrical vacuum feedthrough structure 200 that functions both as electrical ultra-high vacuum compatible chip carrier and a vacuum seal between the detector in the vacuum chamber 202 and the read-out electronics of the detector in ambient air 204.

As will be shown hereunder in more detail, the electrical vacuum feedthrough structure may increase both the performance as well as the implementability and ease-of-use of those detectors in ultra-high vacuum MSI applications.

The electrical vacuum feedthrough structure may comprise a printed circuit board (PCB) 206 mounted on a support structure. The support structure may comprise a support block 208 and a vacuum flange 210. The vacuum flange may be configured so that it can be fixed to an opening in the vacuum chamber, e.g. an opening of the vacuum chamber of the ion microscope.

The PCB has a first (back) surface 212, which is fixed to the support/cooling block, and a second (top) surface 214, on which one or more detectors 216 may be mounted.

The PCB, which will be explained in more detail with reference to FIG. 3, may comprise a plurality of first electrical contacts, e.g. conductive (bonding) pads, located on its top surface, which are electrically connected to a plurality of second electrical contacts located on its back surface. Conductive lines embedded in the PCB may establish electrical connections between the first and second electrical contacts.

The one or more detectors in the vacuum chamber may be electrically connected to the plurality of first electrical contacts so that the detectors can be read-out by read-out electronics, which is electrically connected to the second electrical contacts at the backside of the PCB which is at ambient pressure.

Further, in an embodiment, a substantial part of the top surface of the PCB may be covered with a first thermal conductive layer and the back surface of the PCB may be covered with a second thermal conductive layer. In one embodiment, the thermal conductive layers may be metallic layers comprising aluminium, copper and/or silver. Thermal contact between the first and second layers may be established by a plurality of thermally conductive vias, which extend through the PCB. A detector may be fixed to the PCB by bonding it to the first thermal conductive layer using a suitable thermally conductive glue.

Similarly, the second thermal conductive layer may be fixed to the mounting block using a thermally conductive glue. The mounting block may be made thermally conductive material, preferably a metal comprising copper and/or aluminium. The thermal mounting block may be connected to a cooling element for cooling the block to a certain constant temperature.

Hence, the PCB comprising the plurality of thermal conductive vias the realization of a very good thermal contact with the mounting block with the detector, may function as a thermal reservoir for dissipating the heat generated by the detectors during operation. The back-side of the mounting block, which is in ambient air, may be connected to a cooling element, comprising e.g. one or more Peltier elements for cooling the mounting block and the detectors at a desired temperature.

Cooling of the detectors is important as a detector, such as the Medipix detector, may generate as much as 15 µW/pixel. Without cooling such detector reaches temperatures above 140 degrees Celsius within 45 minutes of in-vacuum operation, which is fatal to the detection system and indicates the need for an active cooling system.

One or more openings 218 in the support block may expose part of the backside of the PCB including the second electrical contacts. In one embodiment, the second electrical contacts may be arranged in a connector 220, e.g. a standard electrical connector, which allows a fast connection to the read-out electronics of the detectors.

In one embodiment, an MCP 222 may be mounted onto the support structure so that it is positioned over the one or more detectors.

Figure 3B:
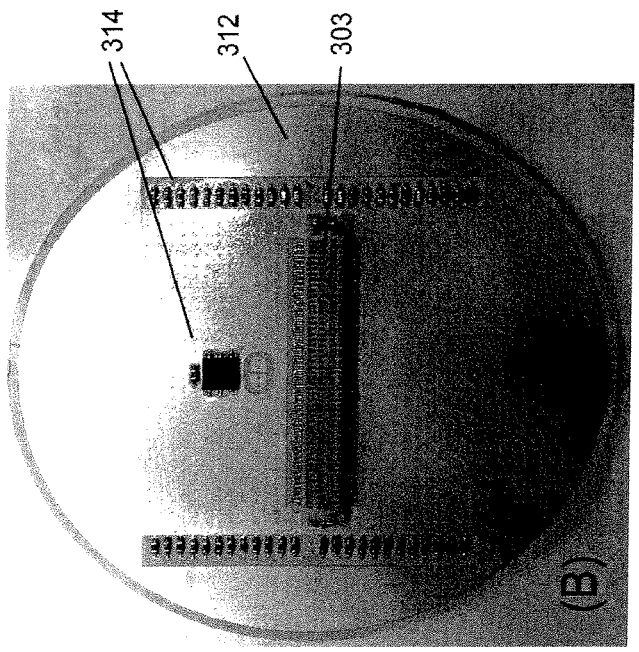
FIG. 3A-3C depicts photos of the back and top surface of a printed circuit board and a schematic cross section of a printed circuit board according to an embodiment of the invention.
Figure 3A:
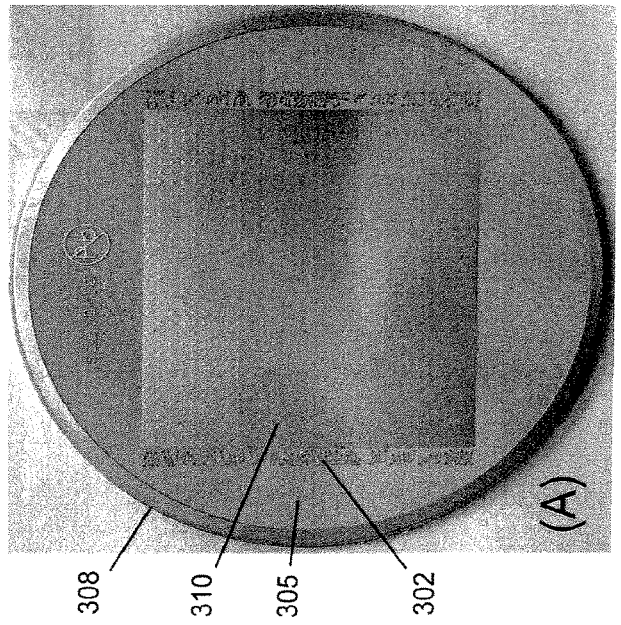
Figure 3C:
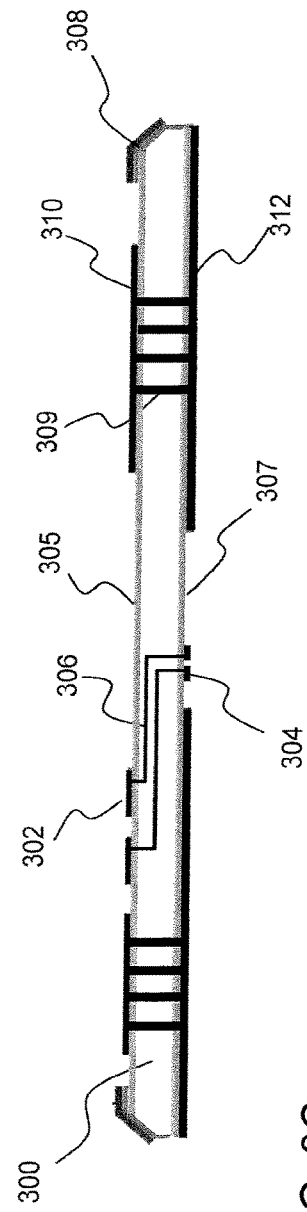

FIG. 3A-3C depict photos of the top and backside of the PCB and a schematic cross-section of the PCB 300. FIGS. 3A and 3B depict an exemplary PCB which is of circular shape. In this particular embodiment, it has a diameter of about 50 mm and a thickness of about 1.6 mm. Depending on the application and/or the number of detectors the PCB may have any suitable size.

The top surface of the PCB may comprise first electrical contacts 302, e.g. bonding pads, for electrically connecting the signal leads of the detector(s) to second electrical contacts 304 at the back side of the PCB. These second electrical contacts may connected to an electrical connector 303 which is mounted on the backside of the PCB as shown in FIG. 3B. Electrically conducting lines 306 embedded in the PCB material may electrically connect the first and second electrical contacts. The PCB may comprise a plurality (a large number) of contacts and embedded conductive lines so that it may function as a highly integrated electrical vacuum feedthrough. For example, depending on the particular application and/or the number of detectors mounted thereon, a PCB may comprise between 100 and 2000 conductive lines electrically connecting first electrical contacts at the top surface to second electrical contacts at the back surface.

In one embodiment, a multilayer PCB, e.g. a standard, multilayer FR-4 PCB, may be used. In other embodiments, other suitable PCB's may be used as well, including PCBs based on low temperature co-fired ceramics (LTCC) or high-temperature co-fired ceramics (HTTCC), one-, two- and multi-layer Metal Core PCB and/or ceramic PCB, e.g. a ceramic-filled polytetrafluoroethylene (PTFE) composite PCB. The use of such PCBs bares the advantages of easy, cheap, reliable and well-established electrical design and fabrication. In addition, PCBs may be manufactured in various shapes (rectangular, circular) and sizes (from few mm up to tens of cm in diameter).

In one embodiment, at least the top-surface of the PCB is coated with a ultra-high vacuum sealant layer 305, which prevents the PCB from out-gassing. In embodiment, the UHV sealant layer may comprise a liquid crystalline polymer (LCP) material. In another embodiment, also the backside of the PCB may be coated with a UHV sealant layer 307. In an embodiment the sealant layer may comprise a LCP material. The LCP material may prevent the PCB from out-gassing. A suitable LCP material such as R/Flex® 3600 Single Clad Laminate of Rogers Corporation may be used. In another embodiment, the UHV sealant layer may comprise Neoflon® PolyChloroTriFluoro-Ethylene or DuPont Vespel® SP-1 Polyimide or equivalents thereof.

In one embodiment, the edges of the PCB may be sealed with a metal layer 308 comprising e.g. copper and/or indium and/or gold to prevent out-gassing from the sides and to provide a metal surface for the vacuum seal between the mounting structure and the vacuum chamber.

In one embodiment, the edges of the PCB may be (partly) beveled under an angle (e.g. between 20 and 50 degrees). The support structure for the PCB (e.g. the support structure comprising the vacuum flange in FIG. 2) may have an opening for receiving the PCB wherein the support structure has beveled edges, which are configured to receive the beveled edges of the PCB such that optimal vacuum sealing in the support structure is ensured. This vacuum sealing is described in more detail with reference to FIGS. 4A and 4B.

To ensure the temperature control of the detectors, a plurality of thermal vias 309 may be distributed over the PCB. The thermal vias, e.g. cylindrical or rectangular metallic vias, extending through the PCB and connecting thermally conductive layers on the top and back surface of the PCB. In one embodiment, the thermal via may have an effective area perpendicular to the normal of the top surface selected from a range between 1 and 5 mm$^2$. In another embodiment, the thermal vias may be arranged in an array having a pitch between 2 and 20 mm.

In one embodiment, the thermal vias may thermally connect one or more first thermally conductive layers 310 on the topside of the PCB with one or more second thermally conductive metallic layers 312, on the back side of the PCB. In one embodiment, the thermally conductive layers may be metallic layers. In an embodiment, these layers may comprise copper, silver, gold and/or aluminum. The detectors may be fixed to the first thermally conductive using a thermally conductive glue. When mounting the PCB in the mounting structure as described with reference to FIG. 2, the second thermally conductive layer may be brought into good thermal contact with the mounting block. This way, excellent thermal contact between the in-vacuum detectors and the mounting block outside the vacuum chamber may be achieved. The mounting block may be further coupled to one or more active cooling elements, e.g. Peltier elements. The thermal coupling may be controlled by controlling the dimensions of the thermal vias and/or the array pitch of the thermal vias.

In a further embodiment, electrical components 314 may be attached to and/or integrated in the backside of the PCB. For example, in one embodiment, a temperature sensor may be incorporated in the PCB in order to monitor the temperature of the detectors and in order to activate the Peltier elements in order to achieve a stable operating temperature for the detectors which may dissipate around 1 W per chip.

Hence, from the above, it follows that the vacuum compatible chip carriers functions as a vacuum-tight seal between the detectors in the vacuum of the vacuum chamber and the in-air read-out components of the system. It allows the realization of a cheap and easy-to-use ultra-high vacuum compatible electrical feedthrough structure that does not require the read-out electronics of the detectors, such as the Medipix and Timepix detectors, to be designed for in-vacuum use. Furthermore, it also allows easy access to the electronics when the detectors are in vacuum.

FIGS. 4A and 4B are photos of the ultra-high vacuum compatible electrical feedthrough structure that is mounted into a stainless steel support (e.g. a vacuum flange).

FIG. 4A is a photo of the in-vacuum frontside of the electrical feedthrough structure, wherein a plurality (in this case 4) tiled detectors 402 is fixed to a PCB 404 as described with reference to FIG. 3A-C. The backside of the detectors may be in thermal contact with the thermally conductive layer(s) on top of the PCB and the electrical contacts of the detectors are wire-bonded to the bonding pads which are located on the topside of the PCB. It is noted that instead of wire bonding, other bonding techniques, e.g. bump bonding, may be used to electrically connect the detector to the bonding pads. The PCB may be fixed vacuum-tight to a stainless steel vacuum flange 405.

FIG. 4B is a photo of the in-air backside of electrical feedthrough structure. The (copper) support block 404 may provide mechanical support for the PCB and function as a heat sink for the detectors. The support block may comprise one or more openings thereby exposing part of the backside of the PCB and the second electrical contacts, which may be connected to an electrical connected 406, which may provide an easy and direct connection to an ambient-air read-out interface board in close vicinity of the in-vacuum detectors so that fast data exchange of more than 1 Gbit/s, preferably between 1 and 25 Gbit/s between the detectors and an data processing computer may be achieved.

Since the LCP-coated PCB functions as a vacuum seal, the connection between the PCB and the stainless steel support (vacuum flange) needs to be vacuum-tight. To that end, the vacuum flange may be machined such that the beveled edge of the chip carrier can be glued into the stainless steel support, which is beveled at the same angle as the PCB edge (see also FIG. 2). A vacuum-compatible glue such as a two-component silver epoxy (Hysol TRA-DUCT 2902, Henkel, Düsseldorf, Germany) may be used. This way the UHV seal has a leak rate of less than $10^{-9}$ mbar·l/s.

In addition, the PCB is mechanically supported by a the support block (FIG. 4B), which prevents mechanical stress due to the pressure difference between the vacuum on the chip-side of the carrier and the ambient pressure on the electronics-side of the board. The PCB and the copper support may be connected using a thermally and electrically conducting glue, e.g. a two-component silver epoxy glue (EPO-TEK® EE129-4, Epoxy Technology, Inc., Billerica, USA). The support block may also function as a heat sink using one or more active cooling elements, such as a Peltier element. The stainless steel support of the carrier may be connected to the vacuum chamber using a (1.5 mm) indium thread. The configuration depicted in FIGS. 4A and 4B exhibits a leak rate of less than $10^{-9}$ mbar·l/s.

Figure 4:
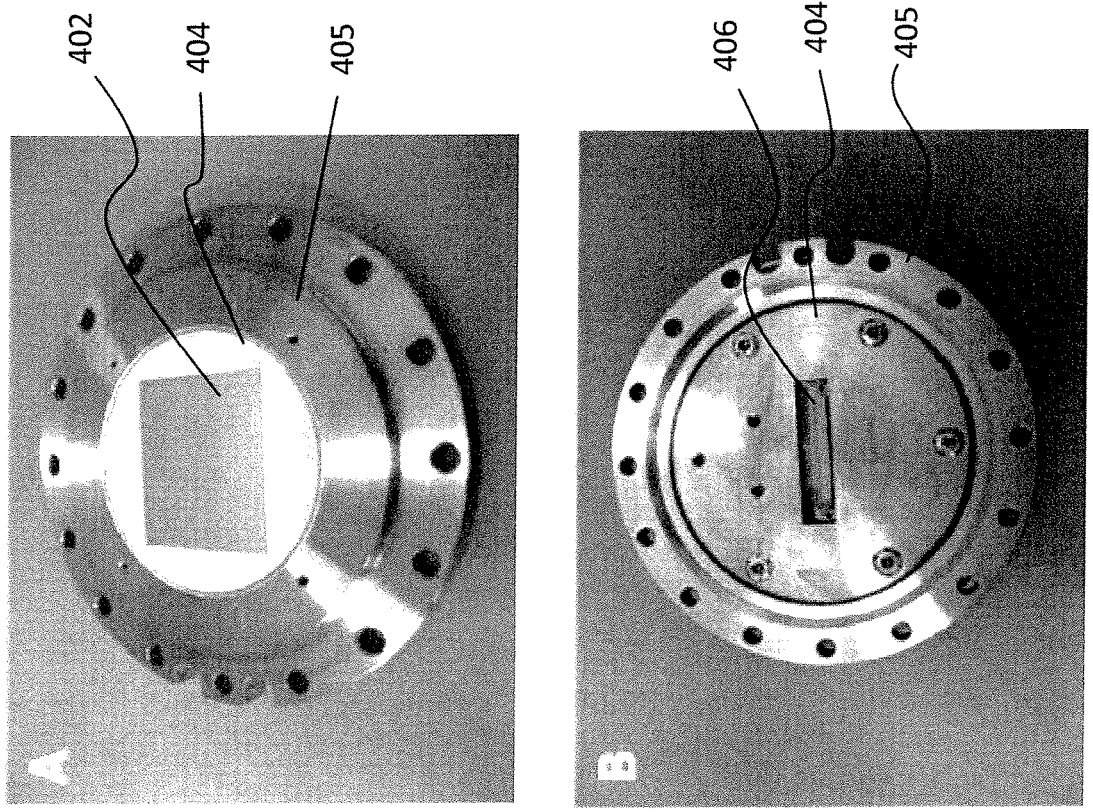
FIG. 4 depicts photos of ultra-high vacuum compatible detector assembly according to an embodiment of the invention.
Figure 5:
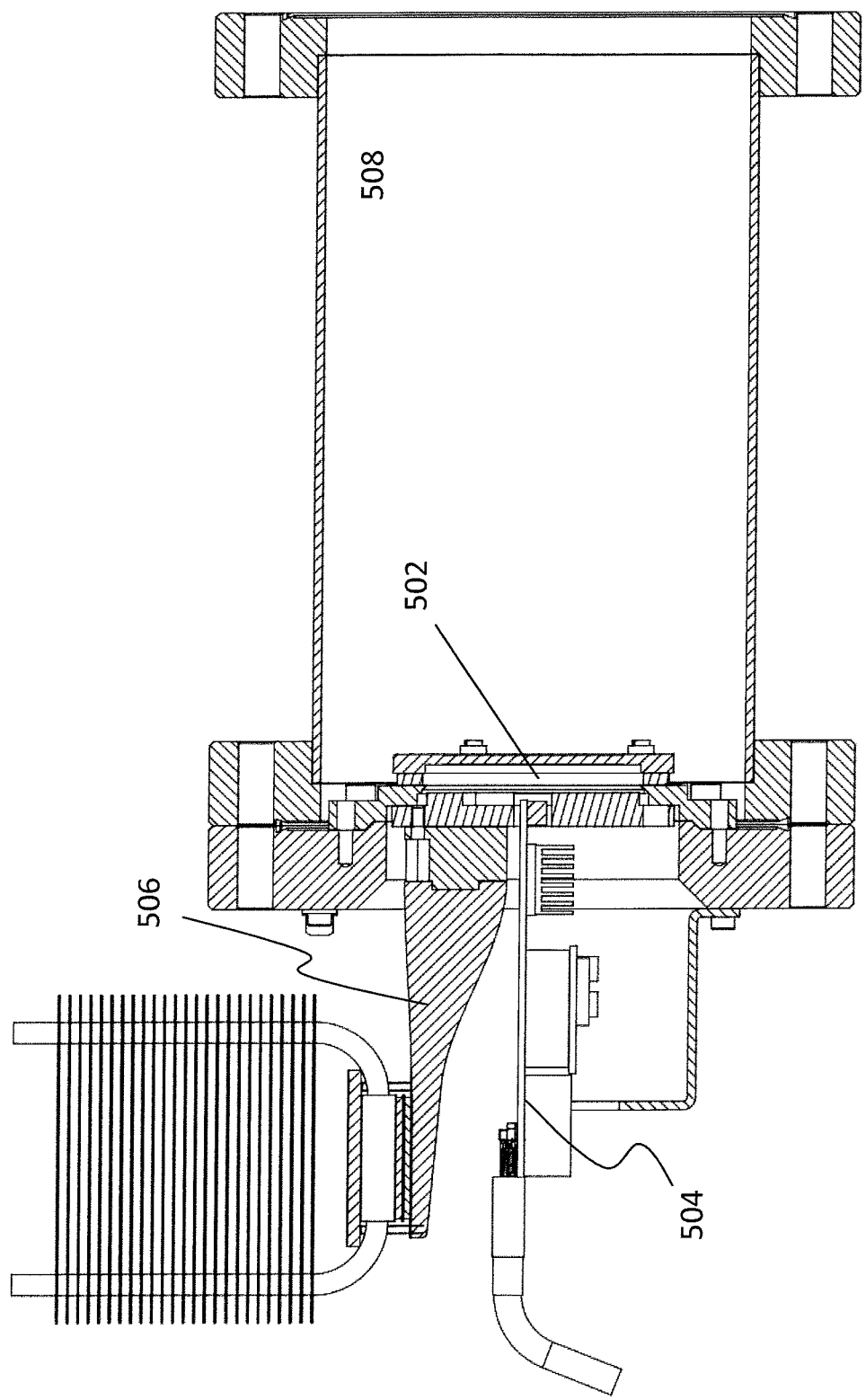
FIG. 5 depicts an ultra-high vacuum compatible detector assembly mounted to a part of an ultra-high vacuum chamber according to an embodiment of the invention.

FIG. 5 depicts an ultra high-vacuum compatible electrical feedthrough structure 502 as described with reference to FIG. 2-4, which is mounted to part of a vacuum chamber 508. Read-out electronics 504, e.g. a 1-25 Gigabyte/s Ethernet card, may be connected to the PCB and cooling means 506, e.g. a ventilator and/or active (Peltier) cooling elements, may be coupled to the metal support block.

The ultra high-vacuum compatible electrical feedthrough structure was mounted to the vacuum chamber of an ion microscope as described with reference to FIG. 1. A vacuum pressure of $1.6 \cdot 10^{-9}$ mbar could be established inside the ion microscope vacuum chamber, which included the in-vacuum detectors. Such pressure represents an improvement of almost two orders of magnitude compared to previous microscope mode IMS systems ($10^{-7}$ mbar), which used differential pumping or in-vacuum mounting of the read-out electronics.

The ultra-high vacuum compatible electrical feedthrough structure enables detection at ultra-high vacuum pressure, which is e.g. necessary in order to image high-mass ions in an IMS system. Moreover, the ultra high-vacuum compatible electrical feedthrough structure and a detector connected thereto provides a very flexible and easy-to-use vacuum compatible detector assembly as the read-out electronics and the cooling electronics are located outside the vacuum chamber in close vicinity to the in-vacuum detectors.

Figure 6:
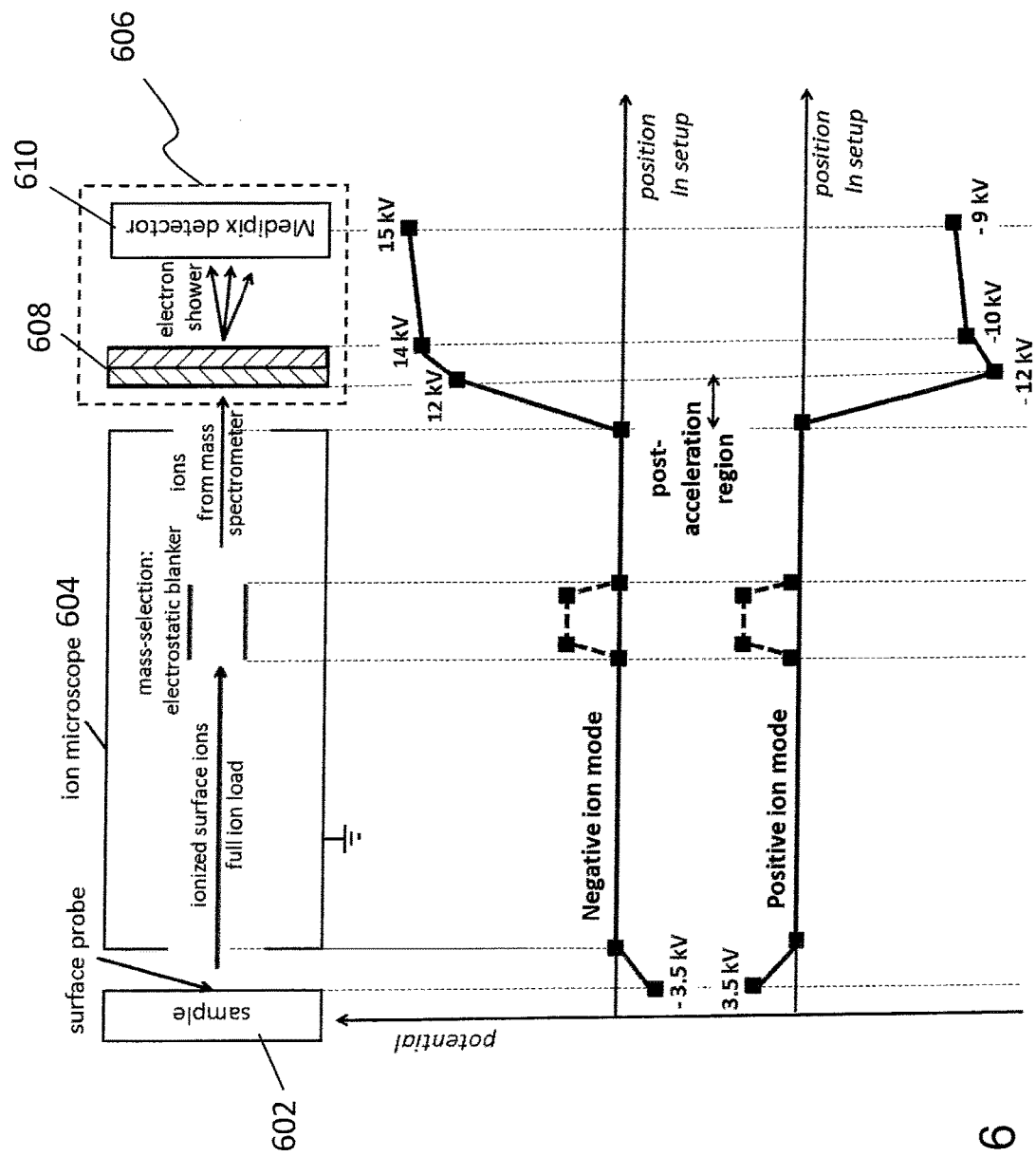
FIG. 6 depicts mass spectrometry imaging detector system configured for operating in a positive ion mode and in a negative ion mode according to an embodiment of the invention.

FIGS. 6A and 6B schematically depict a schematic representation of ion microscope mass spectrometer according to one embodiment of the invention. In particular FIG. 6A depicts parts of a MSI system comprising a sample holder 602, an ion microscope 604 and a detector system 606 comprising a micro-channel plate (MCP) 608 and one or more position-sensitive and time-sensitive imaging detectors 610 such as the Timepix and Medipix detectors. However, in contrast with the known microscope mode MSI system described with reference to FIG. 1, the MSI system in FIG. 6 is configured to measure ion spectra both in a negative and positive ion mode. In one embodiment, the detector system 606 may be mounted to the vacuum chamber of the ion microscope using an ultra-high vacuum compatible electrical feedthrough structure as described with reference to FIG. 2-5.

In order to achieve both positive and negative ion mode operation, the detector assembly may be mounted to the vacuum chamber of the ion microscope wherein an isolator, e.g. an ceramic tube, is used to electrically insulate the detector assembly from the vacuum chamber. Hence, the detector assembly, including the detector chips, read-out electronics, power supplies, cooling system, etc., is floating with respect to the ion microscope detector assembly and may be attached to a variable high voltage source, which allows the detector assembly to be biased between both positive and negative high voltage values. Such scheme provides high voltage (HV) acceleration capabilities for both ion polarities and allows for the analysis of macromolecular ions.

FIG. 6B depicts an exemplary potential diagram for the operation of the floating assembly in positive and negative ion mode. In the negative ion mode, a first negative acceleration voltage (in this case −3.5 kV) may be established between the sample holder and the (vacuum chamber of) the ion microscope. Further, a second positive acceleration voltage between the (vacuum chamber of) the ion microscope and the detection assembly (in this case +15 kV) may be established.

Similarly, in the positive ion mode, a first positive acceleration voltage (in this case +3.5 kV) may be established between the sample holder and the (vacuum chamber of) the ion microscope. Further, a second negative acceleration voltage between the (vacuum chamber of) the ion microscope and the detection assembly (in this case −9 kV) may be established. These high-voltage positive and negative ion modes allow efficient, position- and time-/mass-resolved analysis of complex biological samples for molecular histology using a Medipix or Timepix based detectors. On the basis of this set-up, high-acceleration voltages may be used which are comparable or higher than commercially available ion spectrometers. In one embodiment, the variable high-voltage source may be used to bias the detector assembly between −50 and +50 kV, preferably between −40 kV and +40 kV.

Figure 7:
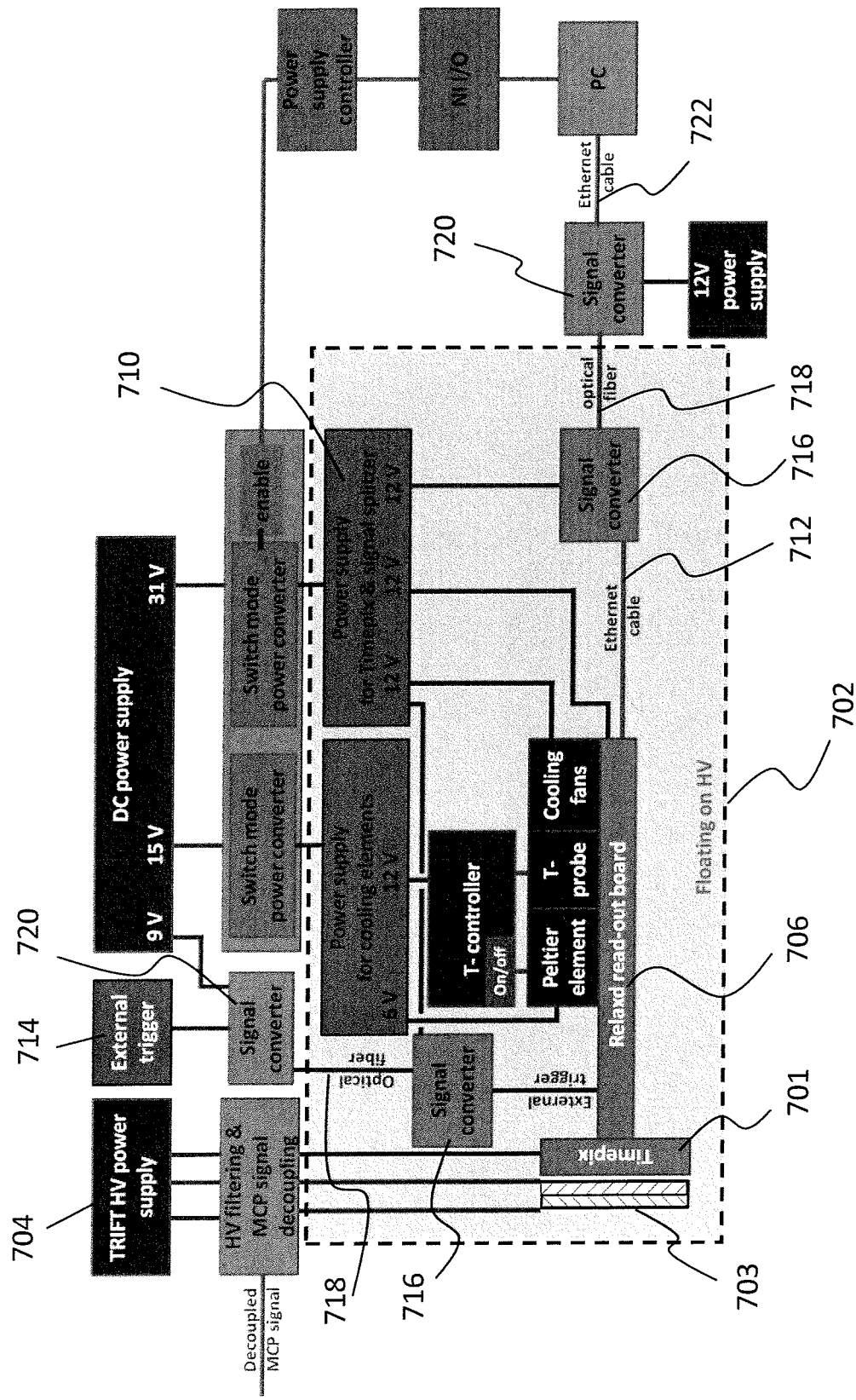
FIG. 7 depicts a schematic of the electrical design of the high voltage setup according to an embodiment of the invention.

FIG. 7 depicts a schematic of the electrical design of the high voltage setup according to an embodiment of the invention. The electronics inside box 702, including the detectors 701 and the MCP 703, are biased at a high-voltage using a HV power supply 704. The electronics contained inside this box are physically contained and isolated from the electronics outside the box. The electronics outside box 702 is at ground potential.

As shown in FIG. 7, the read-out electronics of the detectors, including the Ethernet read-out electronics 706, mounted on the read-out board 708 that is connected to the detector are all biased at a high-voltage. In a similar way, cooling means (e.g. one or more Peltier elements, a temperature sensor, cooling fan, temperature controller) and power supplies 710 for the detectors and other electronics within box 702 may also be biased at high voltage.

Electrical isolation of the electrical signals originating from the detector 701, e.g. the Ethernet signals 712, is realized using electrical/optical conversion wherein the signal (e.g. the Ethernet signal and/or trigger signal) is converted into optical signal using an electrical/optical converter 716 (e.g. an Ethernet-to-optical media converter). The non-conducting optical fibers 718 are fed through the HV setup and connected to an optical/electrical converter 720 (e.g. an optical-to-Ethernet media converter), which is configured to convert an optical signals into an electrical signal 722, e.g. signal transmitted on the basis of the Ethernet protocol to a measurement/control computer. Similarly, an external trigger signal 714 for triggering a TOF measurement may converted into an optical trigger signal and fed through the optical fiber to a convertor biased at high-voltage, which converts the optical trigger signal into an electrical signal which fed to the read-out electronics of the detector.

The high-voltage capabilities of the IMS system as described with reference to FIGS. 6 and 7 allow enable the analysis of high mass macromolecules.

It is submitted that the detection system having high-voltage and/or high-vacuum compatibility capabilities as described with reference to FIG. 2-7 is not only suitable for MSI but also more generally for other analytical techniques that depend on time- and/or position-sensitive measurements of charged particles, including conventional, nonimaging mass spectrometers, electron microscopes (SEM and TEM) and charged particle beam profiling and/or beam monitoring devices.

FIG. 8 depicts MSI spectra measured using a MSI system according to an embodiment of the invention. The MSI spectra were obtained using a microscope mode MRI system as described with reference to FIGS. 6 and 7, wherein the system was operated at a constant MCP gain of $10^7$ and with a potential difference of 900 V between the MCP backside and the Timepix detector.

Figure 8A:
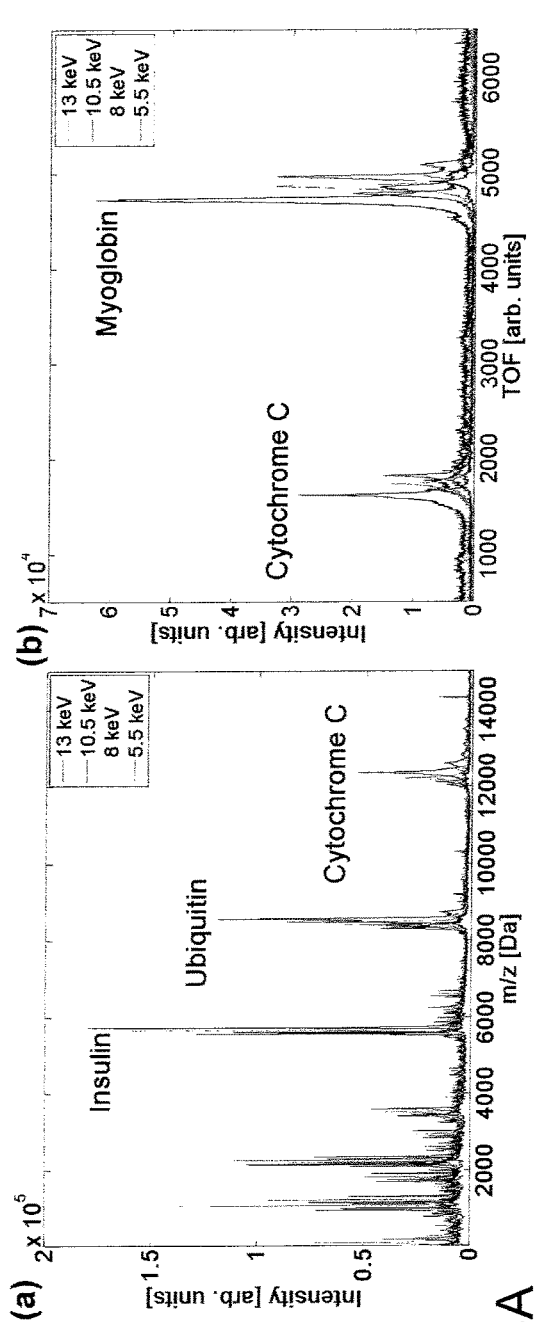
FIG. 8 depicts MSI spectra measured using a MSI system according to an embodiment of the invention.
Figure 8B:
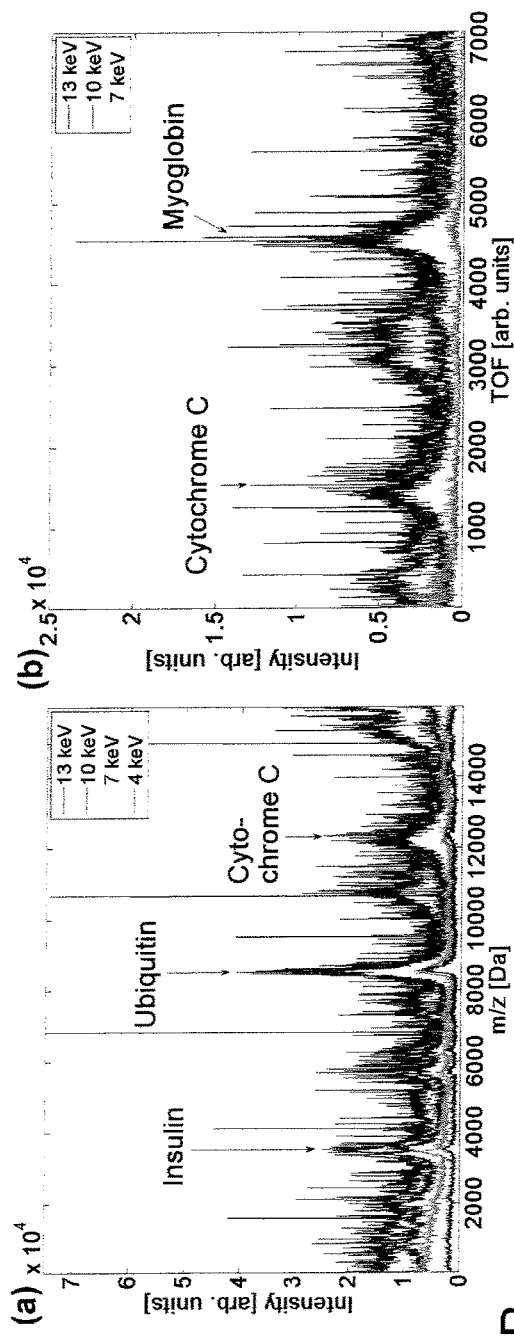

FIG. 8A(a) depicts negative ion mode mass spectra of a protein calibration standard (Bruker Protein Calibration Standard I) in the mass range from 0-15 kDa as a function of the ion acceleration energy form 4-13 keV. The total ion acceleration energy is calculated by the sum of the initial kinetic energy given to the ions in the source of the mass spectrometer (around 3 keV) plus the post-acceleration energy at the detector (2-10 keV for singly charged ions). FIG. 8A(b) depicts the time-of-flight spectrum of the protein calibration standard in the mass range of about 10-18 kDa acquired in the negative ion mode at ion acceleration energies of 7-13 keV. Similarly, FIG. 8B(a) depicts positive ion mode mass spectra of a protein calibration standard in the mass range of 01-14.5 kDa as a function of the total ion acceleration (5.5-13 keV) and FIG. 8B(b) depicts the time-of-flight spectra of the protein calibration standard in the mass range of about 10-18 kDa acquired in the positive ion mode at ion acceleration energies of 5.5-13 keV. FIGS. 8A and 8A clearly demonstrate the functioning of a microscope mode MSI system comprising high-voltage biased floating detector assembly as described with reference to FIGS. 6 and 7. The MSI system is both capable of working both in a high-voltage positive and negative ion mode in the microscope mode so that it has the capability of collecting complementary analytical information.

It is to be understood that any feature described in relation to any one embodiment may be used alone, or in combination with other features described, and may also be used in combination with one or more features of any other of the embodiments, or any combination of any other of the embodiments. The invention is not limited to the embodiments described above, which may be varied within the scope of the accompanying claims.

The invention claimed is:

1. An ultra-high vacuum (UHV) compatible electrical feedthrough structure comprising:
   a printed circuit board (PCB) for carrying one or more detectors and a planar metal support, the PCB comprising a top surface and a back surface, the top surface being covered with a first UHV sealing layer and the back surface being vacuum-tight fixed to the planar metal support;
   the top surface comprising one or more first electrical electrodes and at least a first thermally conductive layer extending at least partly over the top surface; and, the back surface comprising one or more second electrodes and at least a second thermally conductive layer extending at least partly over the back surface;
   the metal support comprising one or more openings exposing one or more parts of the back surface of the PCB, the one or more second electrodes being located at the one or more exposed parts;
   the PCB further comprising one or more conductive wires embedded in the PCB for electrically connecting said one or more first electrodes with said one or more second electrodes respectively; and, one or more thermally conductive vias embedded in the PCB for thermally connecting said at least first thermally conductive layer with said second thermally conductive layer.

2. The feedthrough structure according to claim 1 wherein the at least one first and second thermally conductive layers are thermally coupled to each other by a plurality of thermally conductive vias extending through the PCB.

3. The feedthrough structure according to claim 1 wherein the back surface is covered with a second UHV sealing layer and/or, wherein edges of the PCB are sealed with at least one metallic layer.

4. The feedthrough structure according to claim 1, the metal support being in thermal contact with the second thermally conductive layer.

5. The feedthrough structure according to claim 1 further comprising an UHV flange structure, wherein the UHV flange structure comprises an opening for exposing the top surface of the PCB and wherein edges of the PCB are vacuum-tight fixed to a surface of an edge of said opening.

6. The feedthrough structure according to claim 1, wherein the one or more detectors are in thermal contact with said first thermally conductive layer and wherein said one or more detectors are electrically connected to said one or more first electrodes.

7. The feedthrough structure according to claim 4 wherein said metal support is a thermally conductive metal support.

8. The feedthrough structure according to claim 1 wherein the feedthrough structure is configured to, when vacuum-tight fixed to an opening of a vacuum chamber that is kept at a UHV pressure, expose the one or more second electrodes to ambient pressure and expose the top surface of the PCB covered with the first UHV sealing layer to the UHV pressure.

9. An ultra-high vacuum (UHV) compatible detector assembly comprising:
   an UHV flange structure arranged to fix the detector assembly to an opening of an ultra-high vacuum chamber; and
   a printed circuit board (PCB) for carrying one or more detectors and a planar metal support, the PCB comprising a top surface and a back surface, the top surface being covered with a first UHV sealing layer and the back surface being vacuum-tight fixed to the planar metal support;
   the top surface comprising one or more first electrical electrodes and at least a first thermally conductive layer extending at least partly over the top surface; and, the back surface comprising one or more second electrodes and at least a second thermally conductive layer extending at least partly over the back surface;
   the metal support comprising one or more openings exposing one or more parts of the back surface of the PCB, the one or more second electrodes being located at the one or more exposed parts;
   the PCB further comprising one or more conductive wires embedded in the PCB for electrically connecting said one or more first electrodes with said one or more second electrodes respectively; and, one or more thermally conductive vias embedded in the PCB for thermally connecting said at least first thermally conductive layer with said second thermally conductive layer.

10. The detector assembly according to claim 9 further comprising:
    a read-out board comprising read-out electronics configured to read data generated by said one or more detectors, wherein the read-out electronics are electrically connected to the second electrodes.

11. The detector assembly according to claim 9, further comprising cooling means thermally connected to said planar metal support for dissipating heat produced by said one or more detectors, which are in thermal contact with the metal support.

12. The detector assembly according to claim 9 wherein the detector assembly is configured to, when vacuum-tight fixed to an opening of an ultra-high vacuum (UHV) chamber that is kept at a UHV pressure, expose the one or more second electrodes to ambient pressure while exposing the top surface of the PCB covered with the first UHV sealing layer to the UHV pressure.

13. A detector system comprising:
a detector assembly vacuum-tight fixed to an ultra-high vacuum (UHV) chamber, the detector assembly comprising:
an UHV flange structure arranged to fix the detector assembly to an opening of an ultra-high vacuum chamber; and
a printed circuit board (PCB) for carrying one or more detectors and a planar metal support, the PCB comprising a top surface and a back surface, the top surface being covered with a first UHV sealing layer and the back surface being vacuum-tight fixed to the planar metal support;
the top surface comprising one or more first electrical electrodes and at least a first thermally conductive layer extending at least partly over the top surface; and, the back surface comprising one or more second electrodes and at least a second thermally conductive layer extending at least partly over the back surface;
the metal support comprising one or more openings exposing one or more parts of the back surface of the PCB, the one or more second electrodes being located at the one or more exposed parts;
the PCB further comprising one or more conductive wires embedded in the PCB for electrically connecting said one or more first electrodes with said one or more second electrodes respectively; and, one or more thermally conductive vias embedded in the PCB for thermally connecting said at least first thermally conductive layer with said second thermally conductive layer; and
the one or more detectors and the PCB and the PCB covered with a first UHV sealing layer being exposed to the UHV pressure and the one or more exposed parts of the PCB being exposed to ambient pressure.

14. The detector system according to claim 13, wherein the detector assembly is electrically isolated from said vacuum chamber and wherein the detector assembly is biased at a floating high-voltage.

15. The detector system according to claim 14, wherein the vacuum chamber comprises a sample holder and wherein the one or more detectors are biased at a voltage value between −5 kV and −50 kV, and wherein said sample holder is biased at a voltage value between 1 and 5 kV.

16. The detector system according to claim 15 wherein said one or more detectors are configured as pixelated position-sensitive detector or as pixelated time-sensitive and position sensitive detectors.

17. The detector system according to claim 14, wherein the vacuum chamber comprises a sample holder and wherein said one or more detectors are biased at a voltage value between +5 kV and +50 kV and wherein said sample holder is biased at a voltage value between −1 and −5 kV.

18. The detector system according to claim 13 further comprising:
a read-out board comprising read-out electronics configured to read data generated by the one or more detectors;
wherein the read-out electronics are electrically connected to the second electrodes, and wherein the detector assembly comprises one or more signal converters configured to convert signals from the read-out electronics into an optical signal.

19. The detector system according to claim 13, wherein the vacuum chamber comprises a sample holder, a surface probe and an ion microscope and wherein said detector assembly further comprises at least one micro-channel plate.

* * * * *